(12) United States Patent
J et al.

(10) Patent No.: US 10,892,765 B1
(45) Date of Patent: Jan. 12, 2021

(54) RELOCKING A PHASE LOCKED LOOP UPON CYCLE SLIPS BETWEEN INPUT AND FEEDBACK CLOCKS

(71) Applicant: Aura Semiconductor Pvt. Ltd, Bangalore (IN)

(72) Inventors: Raja Prabhu J, Bangalore (IN); Ankit Seedher, Bangalore (IN); Srinath Sridharan, Bangalore (IN)

(73) Assignee: Aura Semiconductor Pvt. Ltd, Bangalore (IN)

( * ) Notice: Subject to any disclaimer, the term of this patent is extended or adjusted under 35 U.S.C. 154(b) by 0 days.

(21) Appl. No.: 16/822,040

(22) Filed: Mar. 18, 2020

(51) Int. Cl.
  *H03L 7/095* (2006.01)
  *H03L 7/099* (2006.01)
  *H03L 7/093* (2006.01)

(52) U.S. Cl.
  CPC .............. *H03L 7/095* (2013.01); *H03L 7/093* (2013.01); *H03L 7/0991* (2013.01)

(58) Field of Classification Search
  CPC ........ H03L 7/095; H03L 7/093; H03L 7/0991
  See application file for complete search history.

(56) References Cited

U.S. PATENT DOCUMENTS

| 5,790,613 | A | | 8/1998 | Tateishi | |
| 6,100,767 | A | * | 8/2000 | Sumi | H03K 23/665 331/11 |
| 6,265,902 | B1 | | 7/2001 | Klemmer et al. | |
| 6,392,457 | B1 | * | 5/2002 | Ransijn | H03L 7/085 327/12 |
| 2007/0164829 | A1 | * | 7/2007 | Ko | H03L 7/1976 331/17 |
| 2016/0112055 | A1 | * | 4/2016 | Mirajkar | H03L 7/1077 327/158 |

FOREIGN PATENT DOCUMENTS

WO    WO02/073791 A2    9/2002

OTHER PUBLICATIONS

Peadar Forbes and Ian Collins," Lock Detect on the ADF4xxx Family of PLL Synthesizers", AN-873 Application Note, 2006, 08 Pages, Analog Devices.
Fabian Leonardo Cabrera, et al., "Cycle Slip Cancellation by Increasing the PFD Detection Range in PLL Circuits", Downloaded circa Feb. 11, 2020, 04 Pages.

\* cited by examiner

*Primary Examiner* — Vineeta S Panwalkar
(74) *Attorney, Agent, or Firm* — Iphorizons PLLC; Narendra Reddy Thappeta

(57) ABSTRACT

A phase locked loop (PLL) includes a phase detector, a first low-pass filter, an oscillator, a feedback divider and a cycle slip detector. The cycle slip detector is operable to detect at a first time instance, a cycle slip between an input clock and a feedback clock of the PLL. Upon detection of the cycle slip, the cycle slip detector is operable to increase a loop BW of the PLL. As a result, faster relocking of the PLL is achieved upon occurrence of an abrupt and large frequency difference between the input clock and the feedback clock.

20 Claims, 8 Drawing Sheets

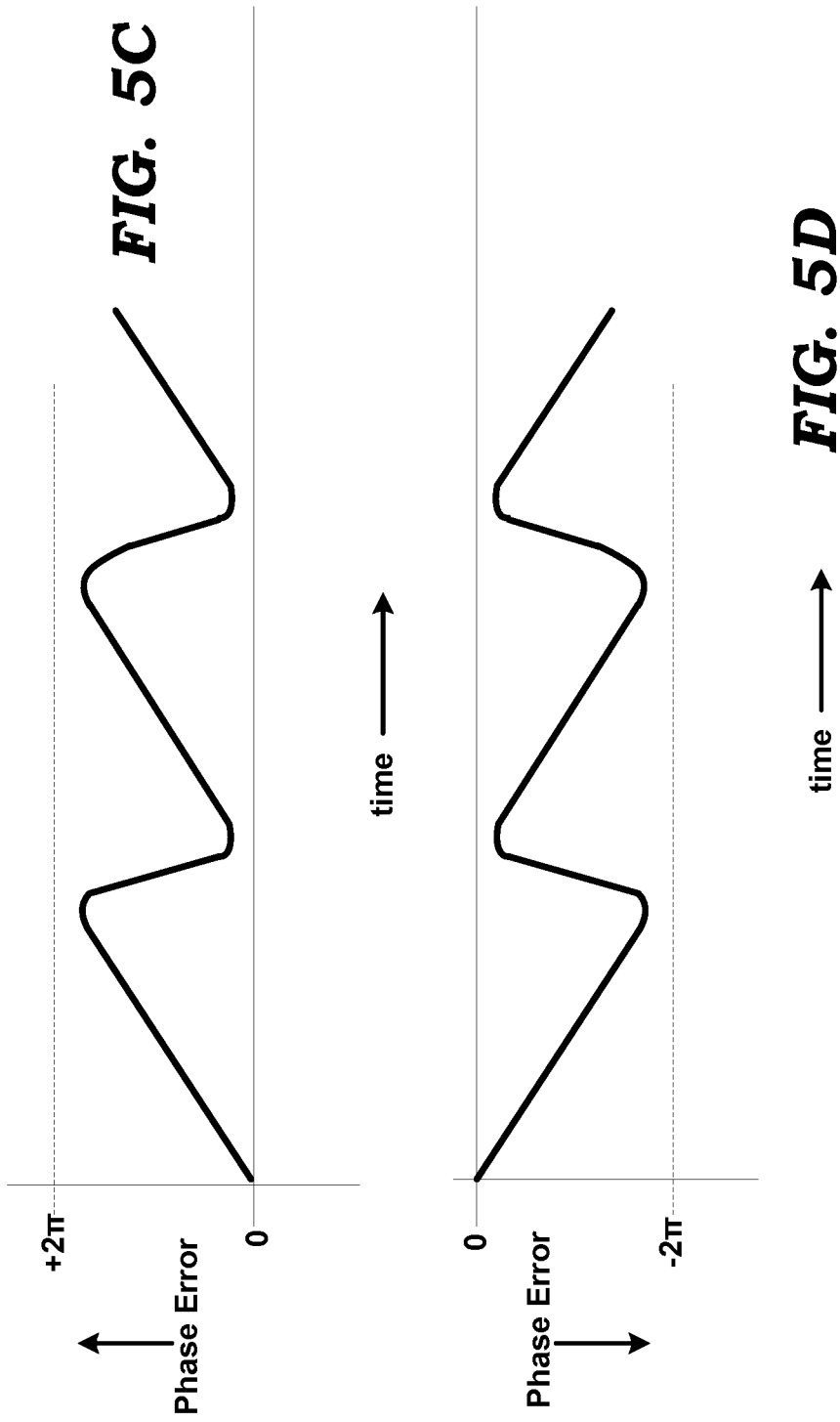

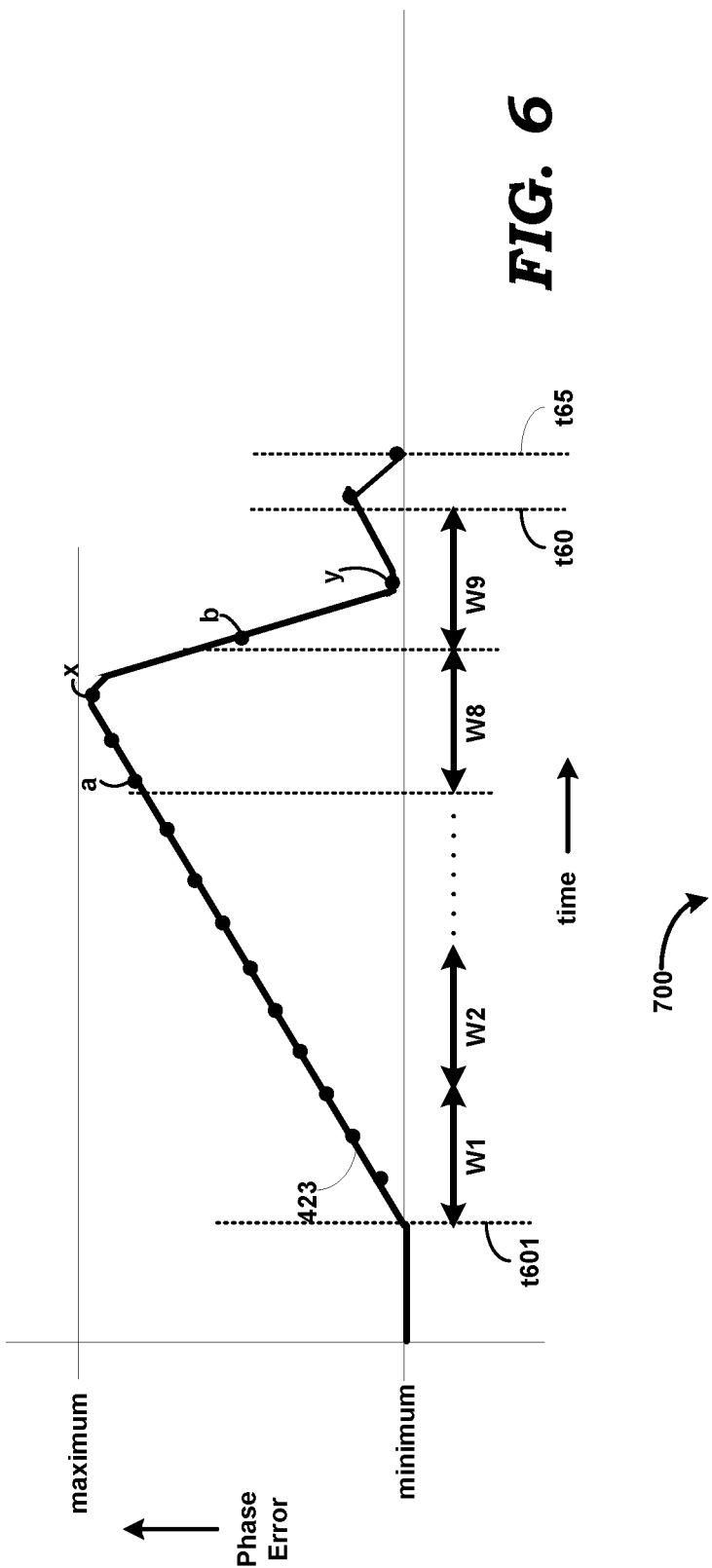

RELOCKING A PHASE LOCKED LOOP UPON CYCLE SLIPS BETWEEN INPUT AND FEEDBACK CLOCKS

BACKGROUND

Technical Field

Embodiments of the present disclosure relate generally to clock generators, and more specifically to relocking a phase locked loop upon cycle slips between input and feedback clock signals

Related Art

Phase locked loops (PLL) are frequently used to generate clock signal(s). The generated clock signal(s) may be used by other systems/circuitry. Examples of such other systems include telecommunication networks, for example, synchronous optical networks (SONET) and synchronous digital hierarchy (SDH).

A PLL receives an input clock and generates an output clock (the clock signal noted above) usually at a frequency that is a multiple of the frequency of the input clock. A PLL has a feedback path containing a frequency divider that divides the frequency of the output clock to generate a feedback clock. The input clock and the feedback clock are provided as inputs to a phase detector in the PLL. Under locked (steady state) condition, the feedback clock generated by the PLL is in phase and frequency lock with respect to the input clock. However, one or more cycle slips can occur between the input clock and the feedback signals.

A cycle slip generally occurs when, from a locked condition, there occurs a sudden large difference (when compared to the loop bandwidth (BW) of the PLL) between the frequencies of the input clock and the feedback clock so as to cause the phase detector output to cross the boundary from approximately +2π radians or approximately −2π radians to approximately 0 radians. In general, an (abrupt) change from approximately +/−2π radians to approximately 0 (zero) radian in the phase error may indicate a sudden large difference between the frequencies of the input and feedback clocks. Typically, the phase detector output (i.e., the phase error) starts ramping rapidly from 0 to approximately +2π or −2π radians, and then abruptly (for example, within one cycle duration of the input clock) drops to approximately 0 radian. The phase error may again ramp up to approximately +2π or −2π and drop abruptly down to approximately zero several times till frequency and phase lock between the input clock and the feedback clock are established again. A sudden large frequency difference as noted above can occur due to substantially large changes in the frequency (e.g., large frequency step) of the input clock (for example due to the PLL switching to another input clock), or changes in the divide ratio of the frequency divider, etc. Typically, larger the abrupt frequency difference (relative to the BW of the PLL) between the input clock and the feedback clock, more is the number of cycle slips that may occur before the PLL relocks again.

Relocking in such situations refers to the inherent operation of the PLL in which the frequency and phase difference between the input clock and the feedback clock is again brought to zero (although there may still be small variations termed jitter), and resume steady-state operation. Correspondingly, the output frequency of the PLL also changes from a stable initial frequency (before cycle slip) to a stable final frequency (after relocking).

However, the cycle slips may cause the frequency of the output clock to typically oscillate several times before reaching the stable final frequency. The duration of transition from the stable initial frequency to the stable final frequency may be unacceptably long, at least in some environments such as, for example, telecommunication networks as noted above. Accordingly, it may be desirable to minimize the time taken for relocking a phase locked loop upon occurrence of cycle slip(s) between the input and feedback clock signals.

Several aspects of the present disclosure are directed to minimizing the time taken for relocking a phase locked loop upon cycle slips between input and feedback clock signals.

BRIEF DESCRIPTION OF THE VIEWS OF DRAWINGS

Example embodiments of the present disclosure will be described with reference to the accompanying drawings briefly described below.

FIGS. 5C and 5D are diagrams illustrating the general nature of a low-pass filtered version of the phase error between an input clock and a feedback clock of a PLL upon occurrence of cycle slips.

FIG. 6 is a diagram illustrating the manner in which a cycle slip detector determines occurrence of a cycle slip, in an embodiment of the present disclosure.

FIG. 7 is a table containing maximum and minimum values in corresponding observation windows used by a peak-to-peak detector 430 of a cycle slip detector of a PLL, in an embodiment of the present disclosure.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present disclosure, a phase locked loop (PLL) includes a phase detector, a first low-pass filter, an oscillator, a feedback divider and a cycle slip detector. The phase detector is coupled to receive an input clock and a feedback clock, and to generate an error signal representing a phase difference between the input clock and the feedback clock. The first low-pass filter is designed to generate a first filtered error signal by filtering the error signal. The first low-pass filter has a first bandwidth (BW). The oscillator is coupled to receive the first filtered error signal as an input, and is designed to generate an output clock, the frequency of the output clock being determined by a magnitude of the first filtered error signal. The feedback divider is designed to generate each of successive cycles of said feedback clock on counting of a pre-determined number of cycles of the output clock. The cycle slip detector is operable to detect at a first time instance, a cycle slip between the input clock and the feedback clock. Upon detection of the cycle slip, the cycle slip detector is operable to increase the loop BW of the PLL As a result, faster relocking of the PLL may be achieved.

In an embodiment, the cycle slip detector operates to increase the loop BW of the PLL by increasing the BW of the low-pass filter to a higher value than the first bandwidth.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Component

Figure 1:
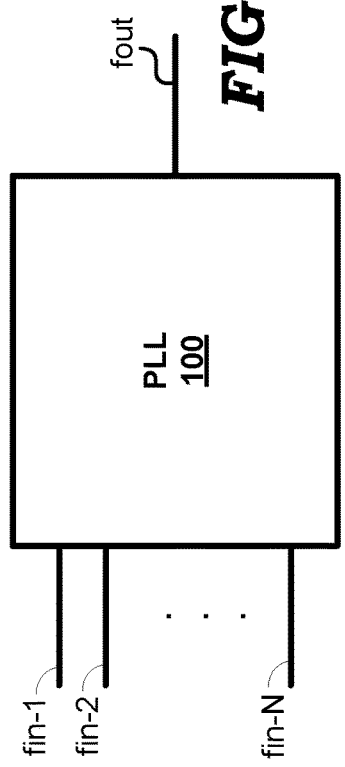
FIG. 1 is a block diagram of an example component in which several aspects of the present disclosure can be implemented.

FIG. 1 is a block diagram of an example component in which several aspects of the present disclosure can be implemented. FIG. 1 shows phase locked loop (PLL) 100 connected to receive input clocks fin-1, fin-2 through fin-N. PLL 100 is operable to select any of the input clocks, and to generate an output clock fout that is based on (or derived from) the selected input clock. Typically, the input clocks and fout have square-wave waveforms, and the frequency of fout is a multiple of the frequency of the currently selected input clock. One of the clocks (e.g., fin-1) is typically used as a primary clock, and the other (N−1) of the input clocks may be redundant clocks. Accordingly, PLL 100 generates fout from the primary clock until the selected primary clock either fails (no or invalid signal) or until a user indicates (via corresponding means not shown) which of the other input clocks is to be used to generate fout.

However, even after PLL 100 has achieved phase/frequency lock with an input clock say, fin-1, it is possible that a large change can occur (abruptly, such as a step change) in the frequency of fin-1. Alternatively, PLL 100 might switch to using another input clock, say fin-2, which may have a different frequency from that of fin-1. A large change in the divide ratio of the frequency divider in the feedback path of PLL 100 can also occur. In general, when such changes occur, the input clock and the feedback clock provided as inputs to the phase detector of PLL 100 are no longer locked in phase and frequency. When the difference in the frequencies of the input clock and the feedback clock is sufficiently large in comparison with the loop bandwidth (BW) of PLL 100 (which is predominantly determined by the BW of the low-pass filter used in PLL 100), cycle slips can occur (as illustrated with respect to FIGS. 5C and 5D below) due to the phase error output of the phase detector increasing from 0 and crossing from approximately +/−2π radians to approximately zero radian.

Figure 2:
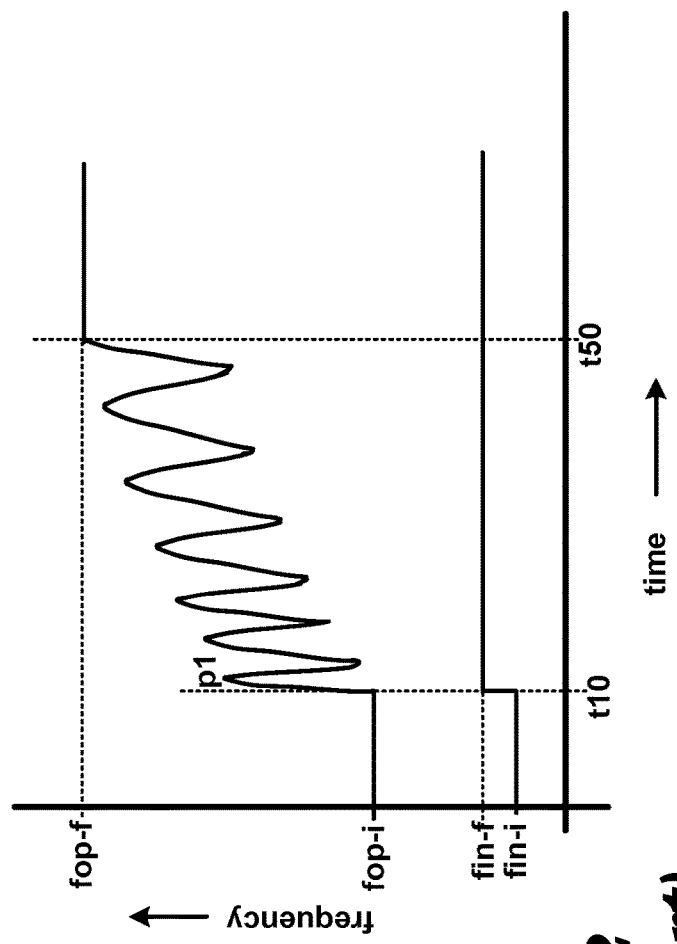
FIG. 2 is a diagram illustrating waveforms of input and output clocks of a prior PLL in response to a large frequency change between the input clock and the feedback clock of the PLL.

As a result, in a prior PLL, the output clock of PLL 100 displays a behavior illustrated in FIG. 2. How much larger the difference in frequencies of the input clock and the feedback clock needs to be as compared to the loop BW of PLL 100 to cause cycle clips generally depends on the transfer functions and/or implementation of the elements (e.g., charge pump, loop filters) in the forward path in PLL 100. As an example, a frequency jump greater than five times the PLL loop BW may result in cycle slips. As is well known in the relevant arts, a PLL acts as a low-pass filter with respect to the input clock. PLL loop BW is the input clock phase modulation frequency at which the closed loop gain of the PLL drops by 3 decibels (dB).

FIG. 2 is an example diagram depicting cycle slips due to a sudden (step) change in the frequency of the input clock. In FIG. 2, the waveform depicting the cycle slips is not to scale, and is provided merely to illustrate cycle slips. In FIG. 2, waveform 210 represents the input clock frequency, which changes from fin-i to fin-f abruptly at t10. As a consequence, the output clock frequency changes from fop-i to fop-f after going through several oscillations, finally relocking at t50. Each peak (such as p1) corresponds to one cycle slip, with the width of the cycle slips increasing progressively before PLL relocks. In FIG. 2, the output clock is shown as going through six cycle slips before settling to the final value of fop-f. In general, large frequency changes between the frequencies of the input clock and the feedback clock, as compared to PLL bandwidth (BW), result in cycle slip oscillations (as shown in with respect to a prior technique in FIG. 2) that could persist for a long time depending on the magnitude of the frequency change relative to the PLL loop BW. This results in very long settling time in response to the frequency change, which may not be acceptable in several environments, such as in telecommunication networks that use Timing/Line card in which a PLL is typically implemented with low jitter-attenuation BWs.

A PLL implemented according to several aspects of the present disclosure minimizes the time taken to relock the PLL upon cycle slips between input and feedback clocks, as described in detail below with respect to example embodiments.

3. Phase Locked Loop

Figure 3:
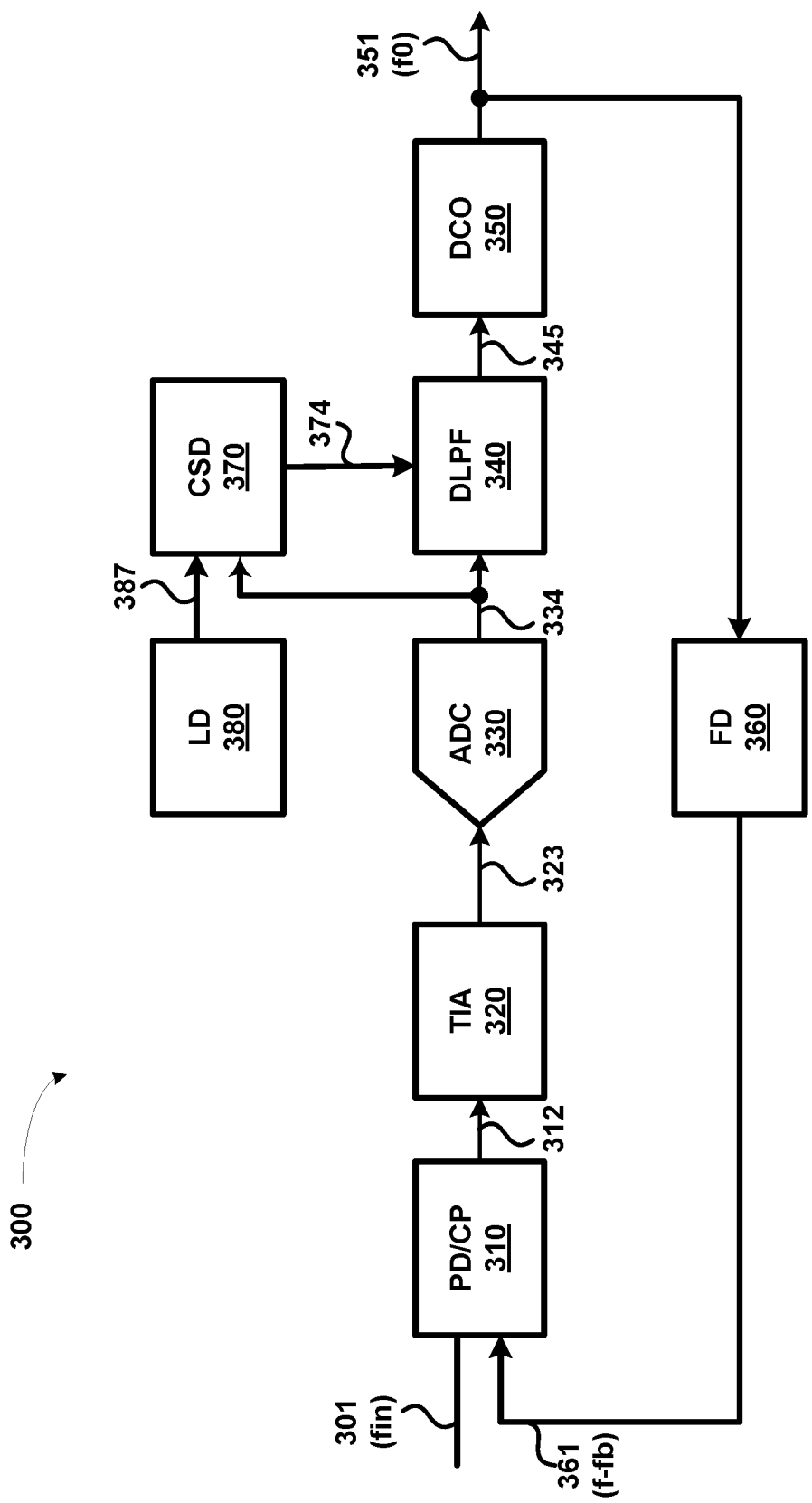
FIG. 3 is a block diagram of a PLL implemented in an embodiment of the present disclosure.

FIG. 3 is a block diagram of a PLL implemented according to several aspects of the present disclosure, in an embodiment. PLL 300, which may be implemented in place of PLL 100 of FIG. 1 is shown containing, phase detector plus charge pump (PD/CP) 310, trans-impedance amplifier (TIA) 320, analog-to-digital converter (ADC) 330, digital low-pass filter (DLPF) 340, digitally controlled oscillator (DCO) 350, frequency divider (FD) 360, cycle slip detector 370 and lock detector (LD) 380.

The specific blocks/components of PLL 300 of FIG. 3 are shown merely by way of example. However, several aspects of the present disclosure can be implemented in alternative embodiments also, as described briefly in sections below.

Referring to FIG. 3, PD/CP 310 receives an input clock fin on path 301. For the sake of conciseness, only one input clock (301) is shown in FIG. 3. However, PLL 300 may receive multiple input clocks and select one of them based on which to generate the output clock 351. PD/CP 310 also receives a feedback clock f-fb on path 361. PD/CP 310 operates to generates an error signal on path 312, the error signal representing a phase difference (phase error) between fin and f-fb. More specifically, the phase detector in PD/CP 310 generates the phase error internally in the form of a UP and DOWN pulses as is well known in the relevant arts, which in turn drive a charge pump. The charge pump in PD/CP 310 either sources into or sinks from output node 312 constant currents whose durations are determined by the width of the UP and DOWN pulses. In alternative embodiments, PD/CP 310 can be implemented as a time-to-digital converter (TDC) or a phase-to-digital converter in a known way, with corresponding modifications to the implementation of other blocks of PLL 300, as would be apparent to one skilled in the relevant arts. PD/CP 310, which can be implemented variously as noted above can in general be viewed and referred simply as "phase detector".

TIA 320 represents a trans-impedance amplifier, and operates to convert the current pulses received on path 312 to correspond voltages. Additionally, TIA 320 performs low-pass filtering on the voltages to generate, on path 323, a filtered representation of the error signal 312.

ADC 320 samples the signal on path 323 at a desired sampling rate (Fs) to generate a sequence of digital values (numbers) on path 334. Although, any type of ADC can be used as ADC 320, in an embodiment of the present disclosure, ADC 320 is implemented as a delta-sigma ADC, which provides a sequence of single-bit (binary) values on path 334. The single-bit values represent the magnitude variations at the ADC input 323 in the form of density variations of logic ones and zeros on path 334. A continuous sequence of all ones represents the upper limit of the range of ADC 320. A continuous sequence of all zeros represents the lower limit of the range of ADC 320. Magnitudes in between the upper and lower limit are represented by a mixture of ones and zeros with the density of ones/zeros being different based on the actual magnitude.

DLPF 340 represents a digital low-pass filter, and operates to filter the output 334 of ADC 330 to generate a filtered version of the phase error between fin and f-fb. DLPF 340 forwards the filtered version as a digital value on path 345. The DLPF transfer function predominantly sets the PLL loop BW, and is programmable digitally to cover a wide range of PLL loop BWs dynamically in response to a digital trigger signal (such as signal 374 described below). In an embodiment, DLPF 340 is implemented to generate a pair of outputs internally that are respectively proportional to, and integral of, signal 334, and the two outputs are summed and then low-pass filtered in the digital low-pass filter. However, in another embodiment, DLPF 340 contains only the digital low-pass filter.

DCO 350 generates an output clock 351, with the frequency of the output clock (fo) 351 being dependent (e.g., proportional) to the digital value received on path 345. As the digital value on path 345 changes, the frequency of output clock 351 changes correspondingly.

FD 360 divides the frequency of output signal 351 by a desired value (termed divide ratio, which may be an integer or a fraction), and generates a frequency-divided clock as feedback clock f-fb on path 361.

LD 380 generates a binary value (lock-detect) on path 367, with the binary value representing whether PLL 300 is currently locked to fin 301 or not. LD 380 may be implemented in one of several well-known ways (for example, based on the frequency error or phase error measurement between fin and f-fb), and the inputs to LD 380 are therefore not shown.

Each of PD/CP 310, TIA 320, ADC 330, DLPF 340, DCO 350, FD 360 and LD 380 may be implemented in a known way.

CSD 370 receives the sequence of single-bit (binary) values on path 334 and operates to detect cycle slip based on processing of those values. Upon detection of the first cycle slip event, CSD 370 operates to increase the loop BW of PLL 300. As is well known in the relevant arts, loop bandwidth of a PLL is a measure of the range of phase modulation frequencies of the input clock of the PLL (here fin 301) which are passed through without substantial attenuation (e.g., up to 3 decibels (db) fall from maximum). The loop bandwidth of the PLL can be generally altered by changing the operating parameters of various components forming the PLL. For example, in the PLL of FIG. 3, the bandwidth of DLPF 340 can be increased or the gain of components such as PD/CP 310 and DCO 350, etc., can be increased, for increasing the loop bandwidth.

In an embodiment, CSD 370 operates to increase the PLL loop BW by increasing the BW of DLPF 340 so as to enable PLL 300 to relock by quickly reducing the phase and frequency difference between fin and f-fb. The specific magnitude of the increased BW is generally based on the nature (e.g., whether a step change) and magnitude of the frequency change between frequencies of fin and f-fb expected in the system containing PLL 300. In the example of a step change in the frequency difference, the increased BW has to be greater than the frequency step change for fast relock of PLL 300 without cycle slips. When relocked, PLL 300 generates output clock f0 with a new steady value of frequency.

The implementation and operation of CSD 370 in an embodiment of the present disclosure are described next.

4. Cycle Slip Detector

Figure 4:
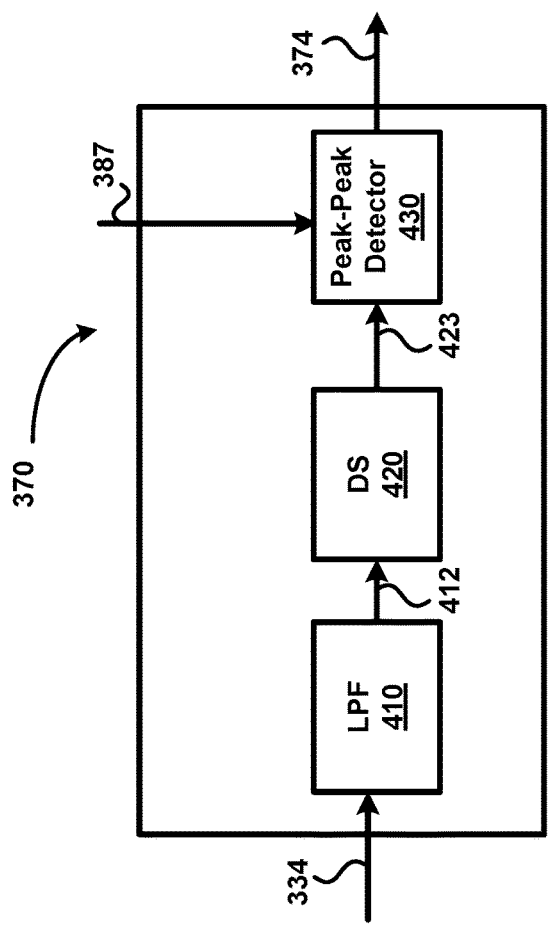
FIG. 4 is a block diagram of a cycle slip detector implemented within a PLL, in an embodiment of the present disclosure.

FIG. 4 is a block diagram of CSD 370 in an embodiment of the present disclosure. CSD 370 is shown containing digital low-pass filter LPF 410, down-sampler (DS) 420 and peak-peak detector 430. Each of blocks 410, 420 and 430 is implemented as a digital unit. However, in other embodiments, some or all of these blocks can be implemented as analog units, as briefly noted in sections below.

Referring to FIG. 4, LPF 410 receives the sequence of single-bit (binary) values on path 334, and operates to perform low-pass filtering of the sequence. The low-pass filtered sequence represents the phase error in PD/CP 310 and is illustrated below. LPF 410 operates at the same sampling rate (Fs) as ADC 330, and thus generates the low-pass filtered sequence in the form of digital values at the rate Fs. LPF 410 forwards the low-pass filtered sequence on path 412.

DS 420 operates to down-sample the digital values received on path 412 at a rate fs_down, and generates a down-sampled sequence of digital values on path 423. The down-sampling by DS 420 enables peak-peak detector 430 to operate at a lower rate (than Fs), and enables some reduction in power consumption in DS 420. When such reduction in power consumption is not required, DS 420 may not be implemented, and path 412 is directly connected to peak-to-peak detector 430, which in such situation operates at rate Fs.

Peak-to-peak detector 430 operates to determine if a cycle slip has occurred by processing the values received on path 423, as described below. It is noted here that lock detect (387) response (to indicate loss of lock) is normally much slower than cycle slip detection response described herein, and therefore is not used to trigger the determination of cycle slip detection itself.

Figure 5A:
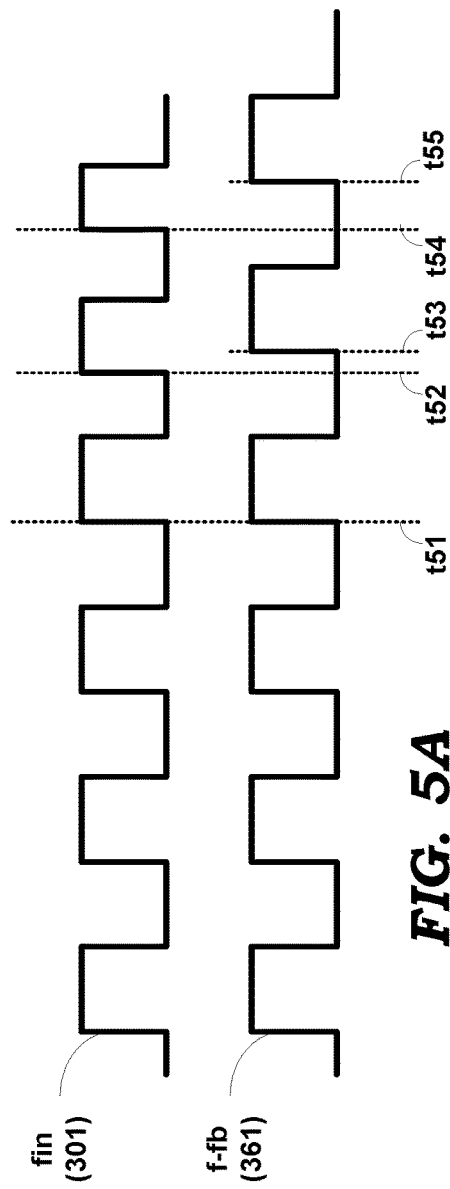
FIG. 5A is a timing diagram used to illustrate a change between the frequencies of an input clock and a feedback clock of a PLL, in an embodiment of the present disclosure.

FIG. 5A shows example waveforms of fin and f-fb. PLL 300 is assumed to be in locked state until time instant t51. Thus, fin and f-fb are in phase and frequency lock until t51. Starting at t51, it is assumed that the frequency of fin has a large step increase in frequency. The phase detector in PD/CP 310 typically compares the leading edges of fin and f-fb to generate the phase error waveforms UP and DOWN (DOWN is not shown in the Figures, but would be well-known in the relevant arts). At t52, the leading edge of fin is ahead of the leading edge of f-fb by a time interval t53-t52, which is greater than zero. At t54, the leading edge of fin is further ahead of the leading edge of f-fb by a time interval t55-t54, which is greater than interval t53-t52.

Figure 5B:
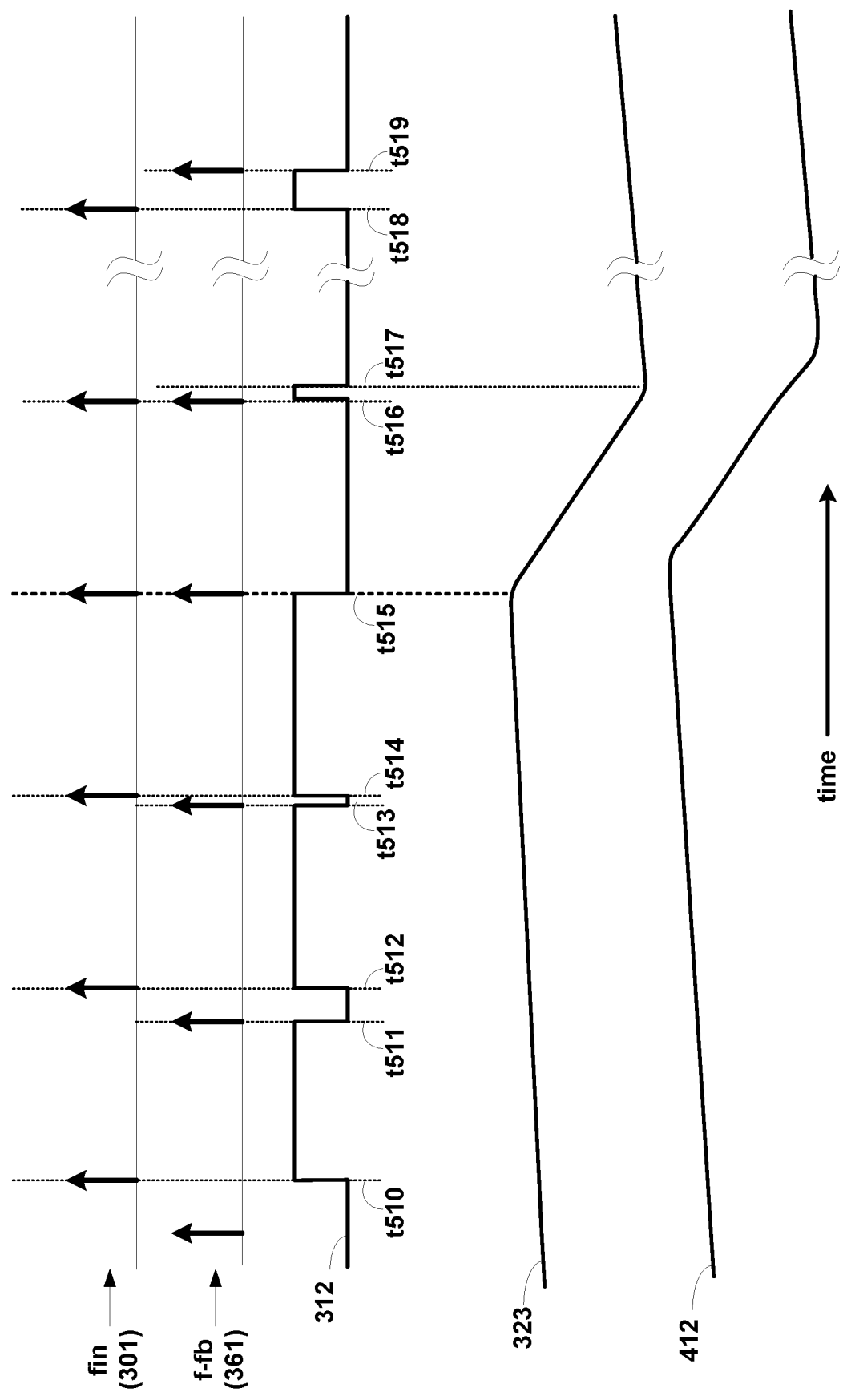
FIG. 5B is diagram illustrating the waveforms at various nodes of a PLL, in an embodiment of the present disclosure.

In general, when a large frequency difference (as compared to the loop BW of PLL 300) occurs between fin and f-fb (after PLL 300 having been in a locked condition), the phase error increases linearly until it crosses the point at which a cycle slip occurs, with such point corresponding to the transition from a phase error of approximately +/−2π radians to approximately zero radian generated by phase detector of PD/CP 310 (FIG. 3). FIG. 5B illustrates waveforms of fin, f-fb, signals at node 312, 323 (all of FIG. 3) and signal 412 of FIG. 4 that occur around (slightly before, at, and after) the instant at which a cycle slip occurs, shown occurring at t515 in FIG. 5B. As noted above, a cycle slip occurs when the phase error between fin and f-fb crosses the boundary from approximately +/−2π radians to approximately zero radian. In FIG. 5B only the rising edges of fin and f-fb are shown. The phase detector of PD/CP 310 is designed to generate UP and DOWN signals representing the phase error between fin and f-fb. In the interest of conciseness, only the UP signal (312) is shown in FIG. 5B. Further, the UP signal (312) is shown without reset delays (reset delays are introduced in the UP and DOWN signals to prevent a dead-zone in the response of the phase detector in PD/CP 310, as is well known in the relevant arts).

As illustrated in FIG. 5B, the rising (leading) edges of fin occur earlier than the rising edges of f-fb until the phase difference reaches approximately 2π radians. The width of UP signal 312 is shown as linearly increasing in intervals t510-t511, t512-t513 and t514-t515. Following one cycle slip (shown occurring at t515), the phase difference between fin and f-fb resumes from approximately 0 radians, and increases gradually as depicted by the increasing widths of UP (312) in intervals t516-t517 and t518-t519. Corresponding to UP (312), the amplified and low-pass filtered output of TIA 320 is also shown linearly increasing until t515, then reducing to a minimum (at t517), and then increasing again. In general, a cycle slip causes the low-pass filtered version of signal 312 to transition abruptly from maximum to minimum. The time taken to transition from maximum (at t515) to minimum (at t517) may be termed "transition time of the cycle slip transition".

FIGS. 5C and 5D depict the general nature of a low-pass filtered version of the phase error between fin and f-fb. FIG. 5C depicts the filtered version when the frequency difference between fin and f-fb is due to a sudden increase in the frequency of fin. FIG. 5D depicts a filtered version when the frequency difference between fin and f-fb is due to a sudden decrease in the frequency of fin. In either case, each abrupt transition in the filtered phase error indicates a cycle slip, which in turn indicates a large abrupt frequency difference in the frequencies of fin and f-fb. It is noted here that smaller and less abrupt frequency differences between fin and f-fb may be tracked without too much delay by the inherent operation of PLL 300, and may not be of concern.

The filtered output of LPF 410 of FIG. 4, namely signal 412 is also shown in FIG. 5B. Signal 412 is a sequence of digital values (LPF 410 being a digital filter), but is shown as a continuous signal for clarity and ease of description. As a result of filtering by LPF 410, the abrupt transition in the sawtooth waveform of the phase error gets spread over many cycles of fin. The cutoff frequency of LPF 410 may be selected to be high enough to capture a substantial range of the full-scale transition (i.e. maximum to minimum change) in the output 334 of ADC 330. In an embodiment, the cutoff frequency of LPF 410 is selected to be high enough to capture at least 90% of the full scale transition of ADC 330 due to cycle slip at the maximum frequency step to be detected. In an embodiment of the present disclosure, the maximum frequency step is around +/−1000 parts per million (ppm) and the frequency of fin before the frequency step is 8 megahertz (MHz), which results in the frequency of the sawtooth phase error to be approximately 8 kilohertz (kHz).

According to an aspect of the present disclosure, the abrupt transition of a low-pass filtered version of the phase error between fin and f-fb (here UP 312), or even a further low-pass filtered version of the phase error such as signal 412, from a maximum to a minimum (or in general from a very large value to a very small value, both of which can be predetermined values based on the implementation details of PD/CP 310, TIA 320, ADC 330 and LPF 410 as well as the magnitude of the frequency change), is recognized as being indicative (i.e., a signature) of an occurrence of a large frequency change between fin and f-fb that the PLL 300 may not be able to correct fast enough. Upon detection of such transition, the loop BW of PLL 300 is increased until relock is achieved again. The manner in which cycle slip is detected is described next with respect to examples.

5. Detection of Cycle Slip

In an embodiment of the present disclosure, peak-to-peak detector 430 (FIG. 4) employs a pair of sliding observation windows to identify the peak-to-peak difference between the absolute values of samples falling in the pair of successive observation windows to determine occurrence of a cycle slip. The pairs of sliding observation windows may cover at least one full cycle slip phase error transition region. The minimum value for the sum of the two sliding duration is determined by the chosen cycle slip detection threshold which is typically a fraction of the full scale phase detection range of the phase detector (for example, +/−0.9*2π radians) and the bandwidth of the low pass filter that is used to process the phase detector output inside the cycle slip detector block FIG. 6 (not to scale) shows the nature of signal 423 as the phase error between fin and f-fb (after having been zero/minimum due to a locked condition) increases from the minimum possible value to the maximum possible value, and then falls to minimum again. The minimum value corresponds to a phase difference of approximately 0 radians, and the maximum value corresponds to a phase difference of approximately +2π radians. The exact values of the minimum and maximum values may be implementation dependent, but generally are based on the implementation of ADC 330 and LPF 410. Signal 423 is a sequence of numbers represented by the dots on the sawtooth waveform of FIG. 6. In FIG. 6, the transition from maximum to minimum of signal 423 represents the first cycle slip following an abrupt large frequency change between fin and f-fb.

With respect to FIG. 6, peak-to-peak detector 430 may start with the successive pair W1 and W2, determine the maximum and minimum sample values falling within W1 and W2, and compute the absolute value (abs) of the difference between the maximum and minimum sample values within W1 and W2. Peak-to-peak detector 430 then compares the absolute value of the difference thus obtained with a predetermined threshold value. Peak-to-peak detector 430 then uses a next pair of observation windows W2 and W3 (W3 is not shown in FIG. 6), and performs a similar computation. Thus, peak-to-peak detector 430 performs such computations for each of a pair of sliding observation windows. For each pair of windows, peak-to-peak detector 430 determines whether the absolute value of the difference for the pair exceeds the predetermined threshold. FIG. 6 shows observation windows W8 and W9 together straddling the transition from maximum to minimum in the magnitude of digital signal 423.

Table 700 of FIG. 7 shows the maximum and minimum values for each of windows W8 and W9. The maximum and minimum sample values in W8 are respectively 'x' and 'a', and the maximum and minimum sample values in W9 are respectively 'b' and 'y'. Considering both W8 and W9 together, the max value in the pair is x and the min value in the pair is y. Peak-to-peak detector 430 then computes the value of abs [(x−y)], compares the result with the predetermined threshold. The width of the successive pairs of observation windows may be chosen such that the total length (time) of the two observation windows is larger than the transition time of the cycle slip transition after the low pass filtering. The ADC 330 full scale output code density range and the subsequent low pass filter bandwidth (of LPF 410) determines the peak-peak range of the filtered phase error during cycle slip. Based on this the cycle slip detection, the predetermined threshold noted above is chosen to be a larger percentage of the peak-peak range (eg. 90% of the peak-peak range). In an embodiment, the frequency of the sliding observation window is set to fs_down/Ndiff_fs_down, wherein fs_down is the sampling rate used by DS 420 of FIG. 4, and wherein Ndiff_fs_down is a programmable integer that determines the duration of the observation window. As noted earlier the sum of the durations of the two observation windows has to be at least greater than the cycle slip transition region after low pass filtering.

A value of abs [(max−min)] greater than the predetermined threshold is indicative of a cycle clip, which in turn is indicative of an abrupt change in the frequency of one of fin and f-fb. Consequently, peak-to-peak detector 430 forwards (at or slightly after time instance t60) to DLPF 340 (FIG. 3) via path 374, a new set filter coefficients to be applied in DLPF 340 to so as to cause the BW of DLPF 340 to have a desired higher BW. The magnitude of such higher BW may be predetermined based on, for example, the maximum expected frequency difference between fin and f-fb due to an abrupt change in the frequency of one of fin and f-fb. DLPF 340 then operates as a low-pass filter with a higher bandwidth than it normally has when fin is in phase and frequency lock with f-fb. Due to such higher BW, PLL 300 is enabled to relock much faster than in the prior technique shown in FIG. 2. The relock is shown happening at t65 in FIG. 6, at which point the phase and frequency error between fin and f-fb is brought back to zero.

Figure 8:
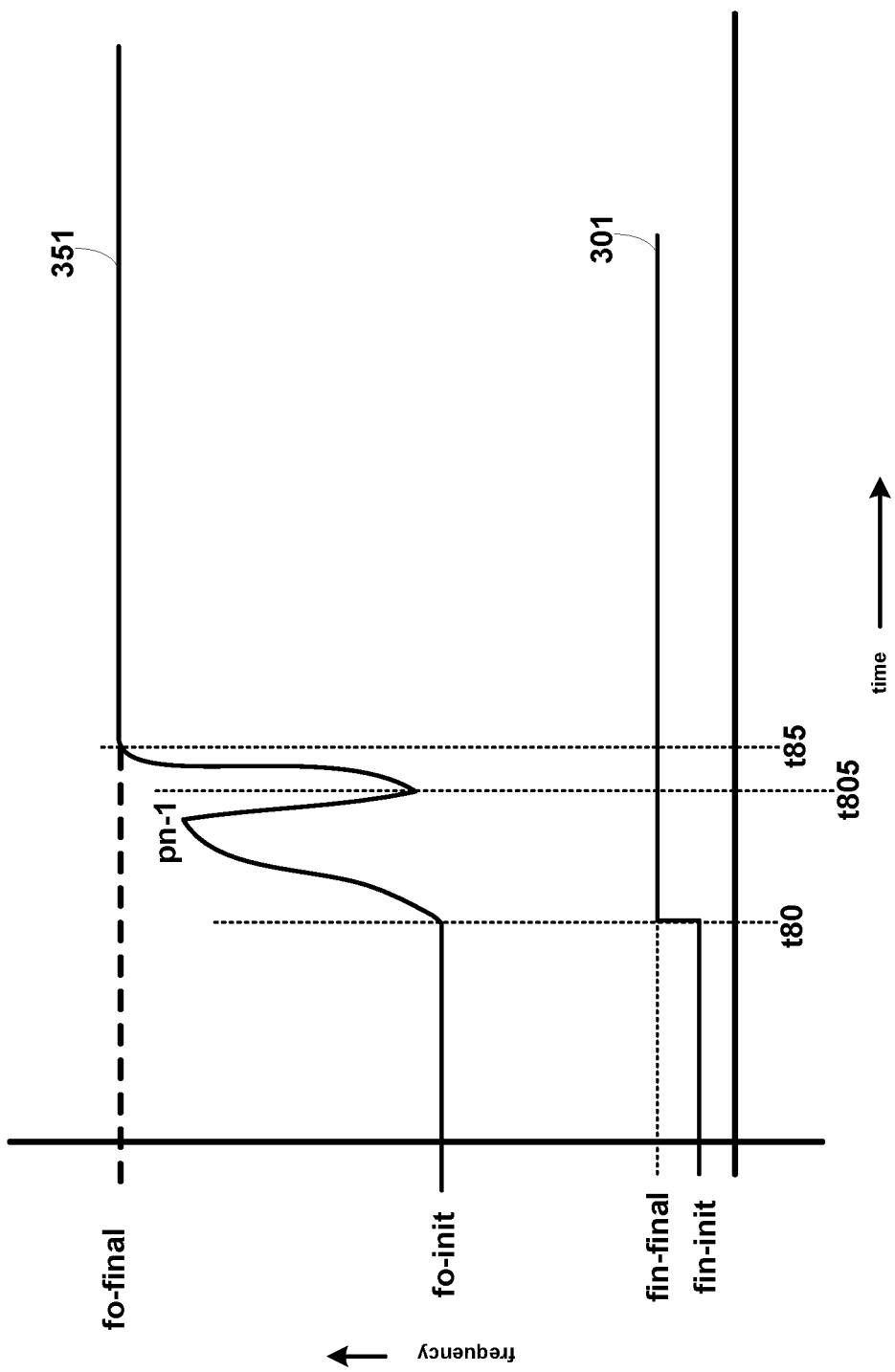
FIG. 8 is a diagram illustrating waveforms of input and output clocks of a PLL implemented according to several aspects of the present disclosure, in response to a large frequency change between the input clock and the feedback clock of the PLL.

FIG. 8 shows the waveforms of fin (301) and fo (351) before and after an abrupt frequency change between fin and f-fb. Signal fin 301 is shown as abruptly transitioning from value fin-init to fin-final at t80. In response to the step change in fin, fo (351) also changes starting from t80. The peak pn-1 corresponds to the first cycle slip following transition at t80. Output clock fo 351 is shown going through one oscillation (peaking at pn-1) and stabilizing to final frequency fo-final at time instant t85, which corresponds to time instant t65 of FIG. 6. The change to larger BW for DLPF 340 is shown as occurring at or around t805, which corresponds to time instant t60 of FIG. 6.

In an embodiment of the present disclosure, the output (lock-detect 387) of LD 380 is used as an indication of whether PLL 300 has relocked. Thus, in the embodiment, at, or slightly later, than t85, lock-detect 387 indicates lock. In response, peak-to-peak detector 430 forwards to DLPF 340 on path 374, the filter coefficients to cause DLPF 340 to operate as before t80, i.e., with the original narrow bandwidth.

However, in another embodiment, lock-detect 387 is not used, and the filter coefficients for the higher BW filter are applied for a fixed time duration in response to cycle slip. At the end of the fixed time duration, PLL 300 operates again with the previously used small/narrow filter BW, and generates fo (351) with minimal jitter. It may be observed that the time taken to relock the PLL (i.e., interval t80-t85) is much shorter than in the prior technique of FIG. 2.

Although PLL 300 is described above as being implemented to have the blocks of FIG. 3, in other embodiments, PLL 300 can be implemented differently, and still be enabled to operate as described in detail above to detect cycle slips and operate to relock the PLL, as would be apparent to one skilled in the relevant arts upon reading the disclosure herein.

As an example, PLL 300 can be implemented as an all-analog PLL except for one logic block. In such an embodiment, PD/CP 310 may be replaced by a mixer (multiplying-type) phase detector, TIA 320 and ADC 330 are not implemented, DLPF 340 is replaced by an analog low-pass filter, DCO 350 is replaced by a voltage-controlled oscillator (VCO), and FD 360 is retained. Additionally, LD 380 and CSD 370 are retained as in FIG. 3, except that CSD 370 may be implemented with an analog low-pass filter in place of digital filter 410. DS 420 is not implemented, and peak-to-peak detector 430 is replaced by a combination of an analog block whose output is processed by a digital block. The analog block is designed to differentiate (with respect to time) signal 412, which would now be an analog signal with a sawtooth waveform similar to digital sequence 423 shown in FIG. 6. At the abrupt transition of signal 412 from maximum value to minimum value, the analog block would generate a large output and thus indicate a cycle slip, but would otherwise (i.e. at other points of the phase error) generate a small constant output. In response to the large output of the analog block, the logic block (which is coupled to the analog block) can operate to change the BW of the analog loop filter of the PLL. Such change could be effected by the use of switches controllable by the logic block to change the circuit components of the analog loop filter so as to cause its BW to be at the desired large value. Alternatively, the PLL may have a pair of loop filters one with small BW and the other with a large BW. The logic block can be operated to remove the small BW filter from the PLL, and connect the large BW filter in its place upon detection of cycle clip by the analog block. Upon relocking, the filters can be swapped again by the logic unit.

As another example, in the blocks of FIG. 3, TIA 320 is not implemented, and instead output 312 of PD/CP 310 is directly connected to a current-input ADC providing a multi-bit digital value as its output on path 334 (as against a single-bit output of a delta sigma ADC. The other blocks are retained to operate as described above.

As yet another example, all blocks of FIG. 3 are retained to operate as described above, with the exception that ADC 330 is implemented to have a multi-bit digital output, digital LPF 410 and DS 420 are omitted, and node 334 is directly connected to input of peak-to-peak detector 430, which is suitably modified to support such changes.

Furthermore, in the examples above, while the loop BW of PLL 300 is noted as being modified by modifying the BW of the loop filter (DLPF 340), in other embodiments, the loop BW of PLL 300 can be modified by, alternatively or additionally, changing other PLL parameters such as for example, the gain provided by other blocks such as PD/CP 310 and DCO 350, as would be apparent to one skilled in the relevant arts upon reading the disclosure herein.

PLL 300 implemented as described above can be used as part of a system as described next with an example.

6. System

Figure 9:
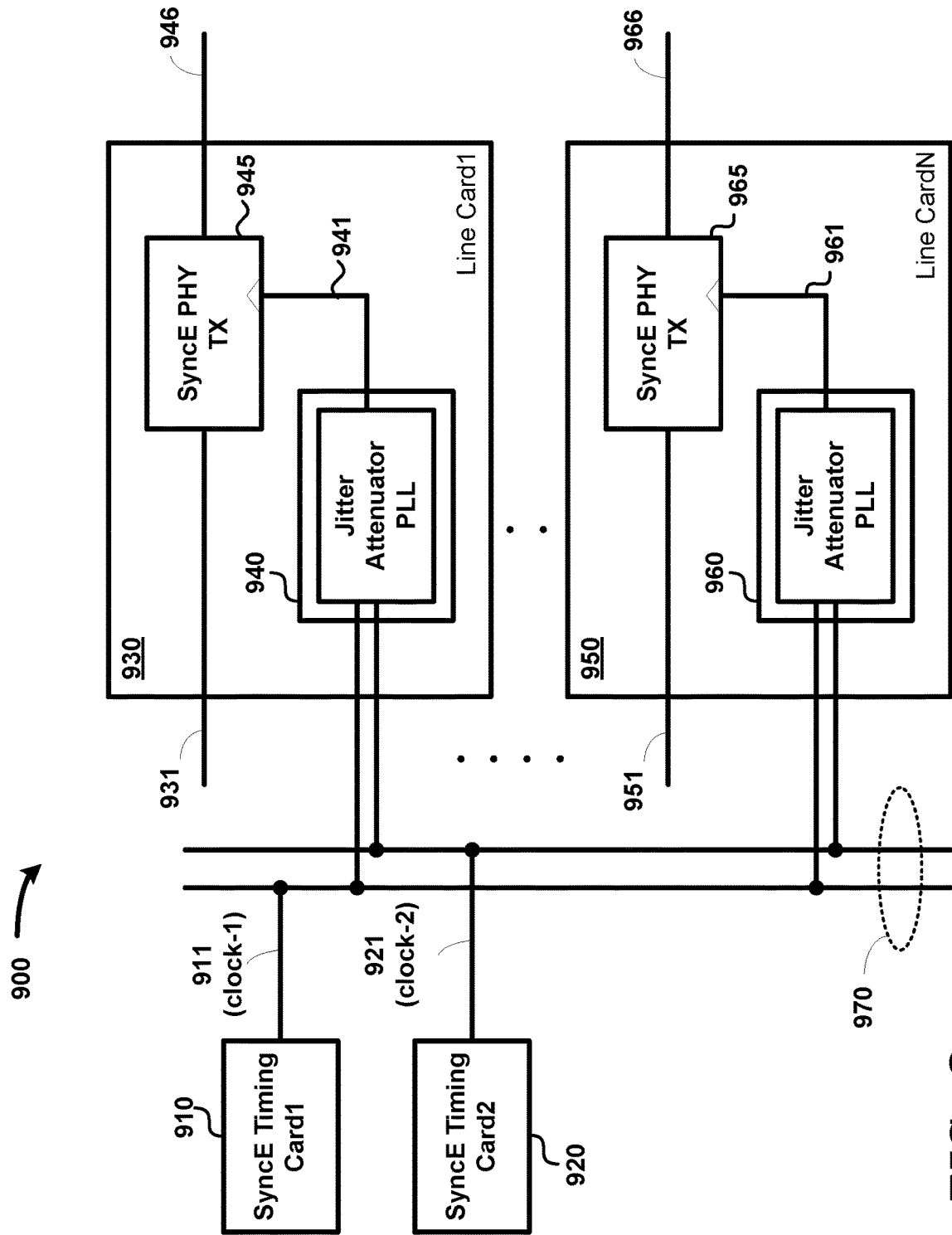
FIG. 9 is a block diagram of an example system containing a PLL implemented according to various aspects of the present disclosure.

FIG. 9 is a block diagram of an example system containing a PLL implemented according to various aspects of the present disclosure, as described in detail above. System 900 is shown containing SyncE (Synchronous Ethernet) timing cards (910 and 920) and line cards 1 through N, of which only two line cards 930 and 950 are shown for simplicity. Although not shown in FIG. 9 in the interest of brevity, each of timing cards 910 and 920 may include PLLs, which can be implemented as described in detail above). Line card 930 is shown containing jitter attenuator PLL 940 and SyncE PHY Transmitter 945. Line card 950 is shown containing jitter attenuator PLL 960 and SyncE PHY Transmitter 965. The components of FIG. 9 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (For example from a timing card such as card 910 or 920). Accordingly, Ethernet packets are re-timed with respect to the master clock, and then transmitted in the physical layer. Thus, data packets (e.g., on path 931 and 932) are retimed and transmitted without any time stamp information being recorded in the data packet. The packets may be generated by corresponding applications such as IPTV (Internet Protocol Television), VoIP (Voice over Internet Protocol), etc.

Thus, line card 930 receives a packet on path 931, and forwards the packet on output 946 after the packet has been re-timed (synchronized) with a master clock. Similarly, line card 950 receives a packet on path 951, and forwards the packet on output 966 after the packet has been re-timed (synchronized) with a master clock.

The master clock (911/clock-1) is generated by timing card 910. Timing card 920 generates a redundant clock (921/clock-2) that is to be used by line cards 930 and 950 upon failure of master clock 911. Master clock 911 and redundant clock 921 are provided via a backplane (represented by numeral 970) to each of lines cards 930 and 950.

In line card 930, jitter attenuator PLL 940 may be implemented as PLL 300 or as any of the alternative embodiments described above in detail, and receives clocks 911 and 921. PLL 940 generates an output clock 941 which is used to synchronize (re-time) packets received on path 931 and forwarded as re-timed packets on path 946. Upon failure of master clock 911, PLL 940 may be designed to switch to clock 921 (to provide clock 921 on path 941).

Similarly, in line card 950, jitter attenuator PLL 960 may also be may be implemented as PLL 300 or as any of the alternative embodiments described above in detail, and receives clocks 911 and 921. PLL 960 generates an output clock 961 which is used to synchronize (re-time) packets received on path 951 and forwarded as re-timed packets on path 966. Upon failure of master clock 911, PLL 960 may be designed to switch to clock 921 (to provide clock 921 on path 961) in the manner described above in detail.

Each of PLLs 940 and 960 is implemented as described in detail above to detect cycle slips and operate to relock quickly upon occurrence of cycle slips.

7. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 3, 4, and 9, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A phase locked loop (PLL) comprising:
 a phase detector coupled to receive an input clock and a feedback clock, said phase detector to generate an error signal representing a phase difference between said input clock and said feedback clock;
 a first low-pass filter to generate a first filtered error signal by filtering said error signal, wherein said first low-pass filter has a first bandwidth (BW);
 an oscillator coupled to receive said first filtered error signal as an input, said oscillator to generate an output clock, wherein a frequency of said output clock is determined by a magnitude of said first filtered error signal;
 a feedback divider generating each of successive cycles of said feedback clock on counting of a pre-determined number of cycles of said output clock; and
 a cycle slip detector operable to:
  detect at a first time instance, a cycle slip between said input clock and said feedback clock; and
  upon detecting of said cycle slip, increase a loop BW of said PLL,
 wherein said cycle slip is the first cycle slip that occurs, wherein said cycle slip detector is operable to increase said loop BW at said first time instance, but not later,
 wherein said cycle slip detector is operable to increase said loop BW of said PLL by causing said filtering of said error signal to be performed using a second bandwidth (BW) for said first low-pass filter, wherein said second BW is greater than said first BW.

2. The PLL of claim 1, wherein said cycle slip is caused by a step change in the frequency of said input clock or the feedback clock.

3. A phase locked loop (PLL) comprising:
a phase detector coupled to receive an input clock and a feedback clock, said phase detector to generate an error signal representing a phase difference between said input clock and said feedback clock;
a first low-pass filter to generate a first filtered error signal by filtering said error signal, wherein said first low-pass filter has a first bandwidth (BW);
an oscillator coupled to receive said first filtered error signal as an input, said oscillator to generate an output clock, wherein a frequency of said output clock is determined by a magnitude of said first filtered error signal;
a feedback divider generating each of successive cycles of said feedback clock on counting of a pre-determined number of cycles of said output clock; and
a cycle slip detector operable to:
detect at a first time instance, a cycle slip between said input clock and said feedback clock; and
upon detecting of said cycle slip, increase a loop BW of said PLL,
wherein said cycle slip detector is operable to increase said loop BW of said PLL by causing said filtering of said error signal to be performed using a second bandwidth (BW) for said first low-pass filter, wherein said second BW is greater than said first BW,
wherein said cycle slip detector causes said filtering of said error signal to be performed using said second BW until relocking of said PLL is achieved, wherein said cycle slip detector causes said filtering to be resumed using said first BW upon occurrence of said relocking of said phase locked loop.

4. The PLL of claim 3, wherein said cycle slip detector causes said filtering of said error signal by using said second BW by changing said first BW of said first low-pass to said second BW.

5. The PLL of claim 3, wherein said cycle slip detector causes said filtering of said error signal by using said second BW by disconnecting said first low-pass filter from said PLL, and connecting a second low-pass filter in place of said first low-pass filter to said PLL, wherein said second low-pass filter is operative with said second BW.

6. The PLL of claim 3, wherein said cycle slip detector comprises:
a third low-pass filter coupled to generate a second filtered error signal by filtering said error signal; and
a peak-peak detector coupled to receive said second filtered error signal, said peak-peak detector operable to determine a maximum value and a minimum value in respective observation windows of a sequence of observation windows, and to indicate that said cycle slip has occurred when the absolute value of difference between said maximum value and said minimum value exceeds a predetermined threshold.

7. The PLL of claim 6, wherein said third low-pass filter has a BW greater than said first BW,
wherein said respective windows comprise a pair of adjacent windows in said sequence of windows, wherein a duration of said pair of adjacent windows is larger than the transition time of the cycle slip transition after the filtering by said third low-pass filter.

8. The PLL of claim 7, wherein said error signal is a sequence of current pulses, said PLL further comprising:
a trans-impedance amplifier to receive said sequence of current pulses, and to convert said sequence of current pulses to corresponding voltages; and
an analog to digital converter (ADC) coupled to receive said error signal, said ADC operable to sample said error signal to generate a sequence of digital values representing said error signal,
wherein each of said first low-pass and said third low-pass filter is a digital filter that operates to filter said sequence of digital values to generate respective sequences of filtered values, wherein said second filtered error signal is a corresponding sequence in said respective sequences of filtered values,
wherein said cycle slip detector further comprises a down sampler to down sample said corresponding sequence to generate a down sampled sequence,
wherein said second filtered error signal is said down sampled sequence, and
wherein said oscillator is a digitally controlled oscillator.

9. The PLL of claim 8, further comprising a lock detector to generate a lock-detect signal indicating whether said PLL is locked or not, and
wherein said ADC is a delta sigma ADC.

10. The PLL of claim 3, wherein said cycle slip is caused by a step change in the frequency of said input clock or the feedback clock.

11. A system comprising:
a line card coupled to receive a data packet, said line card to re-time said data packet with reference to an output clock, and to transmit a re-timed packet;
a first timing card to generate a first clock; and
a second timing card to generate a second clock;
wherein said line card comprises a phase-locked loop (PLL) coupled to receive each of said first clock and said second clock, said PLL to generate said output clock based on one of said first clock and said second clock, wherein said PLL comprises:
a phase detector coupled to receive said one of said first clock and said second clock as an input clock, and a feedback clock, said phase detector to generate an error signal representing a phase difference between said input clock and said feedback clock;
a first low-pass filter to generate a first filtered error signal by filtering said error signal, wherein said first low-pass filter has a first bandwidth (BW);
an oscillator coupled to receive said first filtered error signal as an input, said oscillator to generate said output clock, wherein a frequency of said output clock is determined by a magnitude of said first filtered error signal;
a feedback divider generating each of successive cycles of said feedback clock on counting of a pre-determined number of cycles of said output clock; and
a cycle slip detector operable to:
detect at a first time instance, a cycle slip between said input clock and said feedback clock; and
upon detecting of said cycle slip, increase a loop BW of said PLL.

12. The system of claim 11, wherein said cycle slip detector is operable to increase said loop BW of said PLL by causing said filtering of said error signal to be performed using a second bandwidth (BW), wherein said second BW is greater than said first BW.

13. The system of claim 12, wherein said cycle slip detector causes said filtering of said error signal to be performed using said second BW until relocking of said PLL is achieved, wherein said cycle slip detector causes said filtering to be resumed using said first BW upon occurrence of said relocking of said phase locked loop.

14. The system of claim 13, wherein said cycle slip detector causes said filtering of said error signal by using said second BW by changing said first BW of said first low-pass to said second BW.

15. The system of claim 13, wherein said cycle slip detector causes said filtering of said error signal by using said second BW by disconnecting said first low-pass filter from said PLL, and connecting a second low-pass filter in place of said first low-pass filter to said PLL, wherein said second low-pass filter is operative with said second BW.

16. The system of claim 12, wherein said cycle slip detector comprises:
a third low-pass filter coupled to generate a second filtered error signal by filtering said error signal; and
a peak-peak detector coupled to receive said second filtered error signal, said peak-peak detector operable to determine a maximum value and a minimum value in respective observation windows of a sequence of observation windows, and to indicate that said cycle slip has occurred when the absolute value of difference between said maximum value and said minimum value exceeds a predetermined threshold.

17. The system of claim 16, wherein said third low-pass filter has a BW greater than said first BW,
wherein said respective windows comprise a pair of adjacent windows in said sequence of windows, wherein a duration of said pair of adjacent windows is larger than the transition time of the cycle slip transition after filtering by said third low-pass filter.

18. The system of claim 17, wherein said error signal is a sequence of current pulses, said PLL further comprising:
a trans-impedance amplifier to receive said sequence of current pulses, and to convert said sequence of current pulses to corresponding voltages; and
an analog to digital converter (ADC) coupled to receive said error signal, said ADC operable to sample said error signal to generate a sequence of digital values representing said error signal,
wherein each of said first low-pass and said third low-pass filter is a digital filter that operates to filter said sequence of digital values to generate respective sequences of filtered values, wherein said second filtered error signal is a corresponding sequence in said respective sequences of filtered values,
wherein said cycle slip detector further comprises a down sampler to down sample said corresponding sequence to generate a down sampled sequence,
wherein said second filtered error signal is said down sampled sequence, and
wherein said oscillator is a digitally controlled oscillator.

19. The system of claim 18, further comprising a lock detector to generate a lock-detect signal indicating whether said PLL is locked or not, and
wherein said ADC is a delta sigma ADC.

20. The system of claim 11, wherein said cycle slip is caused by a step change in the frequency of said input clock or the feedback clock.

* * * * *